United States Patent
Lu et al.

(10) Patent No.: US 11,823,745 B2
(45) Date of Patent: *Nov. 21, 2023

(54) PREDICTING AND COMPENSATING FOR DEGRADATION OF MEMORY CELLS

(71) Applicant: Micron Technology, Inc., Boise, ID (US)

(72) Inventors: Zhongyuan Lu, Boise, ID (US); Robert J. Gleixner, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/953,219

(22) Filed: Sep. 26, 2022

(65) Prior Publication Data

US 2023/0012598 A1 Jan. 19, 2023

Related U.S. Application Data

(63) Continuation of application No. 17/221,456, filed on Apr. 2, 2021, now Pat. No. 11,456,036.

(51) Int. Cl.
| | |
|---|---|
| *G11C 7/00* | (2006.01) |
| *G11C 16/26* | (2006.01) |
| *G11C 16/30* | (2006.01) |
| *G11C 16/04* | (2006.01) |
| *G11C 16/20* | (2006.01) |

(52) U.S. Cl.
CPC .......... *G11C 16/26* (2013.01); *G11C 16/0483* (2013.01); *G11C 16/20* (2013.01); *G11C 16/30* (2013.01)

(58) Field of Classification Search
CPC ....... G11C 7/1051; G11C 7/22; G11C 7/1072; G11C 7/1006; G11C 7/1066
USPC ....................... 365/189.15, 189.14
See application file for complete search history.

(56) References Cited

U.S. PATENT DOCUMENTS

| | | | |
|---|---|---|---|
| 9,799,381 B1 | 10/2017 | Tortorelli et al. | |
| 10,269,442 B1 | 4/2019 | Tortorelli et al. | |
| 10,381,075 B2 | 8/2019 | Tortorelli et al. | |
| 11,456,036 B1 * | 9/2022 | Lu ........................ | G11C 13/004 |
| 2014/0169066 A1 | 6/2014 | Ramaswamy | |

(Continued)

OTHER PUBLICATIONS

U.S. Appl. No. 16/729,731, entitled, "Three-State Programming of Memory Cells", filed Dec. 30, 2019, 35 pages.

(Continued)

*Primary Examiner* — Son T Dinh
(74) *Attorney, Agent, or Firm* — Brooks, Cameron & Huebsch, PLLC (57) ABSTRACT

The present disclosure includes apparatuses, methods, and systems for predicting and compensating for degradation of memory cells. An embodiment includes a memory having a group of memory cells, and circuitry configured to, upon a quantity of sense operations performed on the group of memory cells meeting or exceeding a threshold quantity, perform a sense operation on the group of memory cells using a positive sensing voltage and perform a sense operation on the group of memory cells using a negative sensing voltage, and perform an operation to program the memory cells of the group determined to be in a reset data state by both of the sense operations to the reset data state.

20 Claims, 6 Drawing Sheets

(56) References Cited

U.S. PATENT DOCUMENTS

2017/0256309 A1\* 9/2017 Yoon .................. G11C 16/24
2020/0051629 A1   2/2020 Baek

OTHER PUBLICATIONS

U.S. Appl. No. 16/729,787, entitled, "Multi-State Programming of Memory Cells", filed Dec. 30, 2019, 48 pages.

\* cited by examiner

PREDICTING AND COMPENSATING FOR DEGRADATION OF MEMORY CELLS

PRIORITY INFORMATION

This application is a Continuation of U.S. application Ser. No. 17/221,456, filed on Apr. 2, 2021, the contents of which are incorporated herein by reference.

TECHNICAL FIELD

The present disclosure relates generally to semiconductor memory and methods, and more particularly, to predicting and compensating for degradation of memory cells.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

The present disclosure includes apparatuses, methods, and systems for predicting and compensating for degradation of memory cells. An embodiment includes a memory having a group of memory cells, and circuitry configured to, upon a quantity of sense operations performed on the group of memory cells meeting or exceeding a threshold quantity, perform a sense operation on the group of memory cells using a positive sensing voltage and perform a sense operation on the group of memory cells using a negative sensing voltage, and perform an operation to program the memory cells of the group determined to be in a reset data state by both of the sense operations to the reset data state.

During the sensing of a resistance variable memory cell, such as a self-selecting memory cell, a voltage may be applied to the memory cell, and the data state of the cell can be determined based on the amount of current that flows through the cell in response to the applied voltage. For example, when the voltage is applied to the memory cell, the resulting amount of current that is on a signal line (e.g., bit line or word line) to which the memory cell is coupled can be compared to a reference current, and the state of the memory cell can be determined based on the comparison. For instance, the cell can be determined to be in a first (e.g., reset) data state if the comparison indicates the signal line current is less than the reference current, and the cell can be determined to be in a second (e.g., set) data state if the comparison indicates the signal line current is greater than the reference current.

However, as such sense operations are performed on a memory cell during operation of the memory, the voltage applied to the memory cell during each sense operation can cause the memory cell to gradually degrade over time. For example, the voltage applied to the memory cell can cause the threshold voltage of the cell to drift (e.g., change) to a higher or lower magnitude value over time, which can eventually cause the memory cell to be determined (e.g., sensed) to be in a different data state than the state to which the cell is actually programmed. For instance, this threshold voltage drift may cause a memory cell that is programmed to the first (e.g., reset) data state to be erroneously determined to be in the second (e.g., set) data state. Such a phenomenon can be referred to as read disturb (e.g., read disturb on reset), and can reduce the performance and/or lifetime of the memory.

Such read disturb in a memory cell can be compensated for by performing an operation (e.g., a write refresh operation) to refresh the cell to its originally programmed data state. In some previous approaches, the determination of when to perform such a refresh operation can be made based on the error rate (e.g., the raw bit error rate) of the sense operations being performed on the memory (e.g., the refresh operation can be triggered once the error rate reaches a certain threshold). However, this error rate may not be an accurate indicator of the read disturb actually occurring in a memory cell. For instance, a memory cell may degrade faster than what is reflected by the error rate, and/or a memory cell that has degraded may not necessarily result in an erroneous data reading. Further, some error correction operations may have a low error tolerance, and therefore may fail before the refresh operation is triggered. Accordingly, the error rate may not always provide a reliable indicator of when to perform a refresh operation on a memory cell to compensate for read disturb.

Embodiments of the present disclosure, in contrast, can reliably (e.g., accurately) predict when read disturb in memory cells has occurred and/or will occur, and accordingly, can provide a reliable indicator of when to perform a refresh operation on the memory cells to compensate for the read disturb. For example, embodiments of the present disclosure can use the quantity of sense operations being performed on the memory cells (e.g., the read workload of the cells) to determine when to trigger an evaluation of whether a refresh operation is needed to compensate for read disturb. The evaluation can include performing two sense operations (e.g., a double read operation) on the memory cells using sensing voltages of opposite polarities, and the result of the two sense operations can be used to determine whether to perform a refresh operation on the memory cells. Accordingly, embodiments of the present disclosure can increase the performance and/or lifetime of the memory of the memory cells, as compared with previous approaches (e.g., approaches that use error rate to determine when to perform a refresh operation).

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

Figure 1:
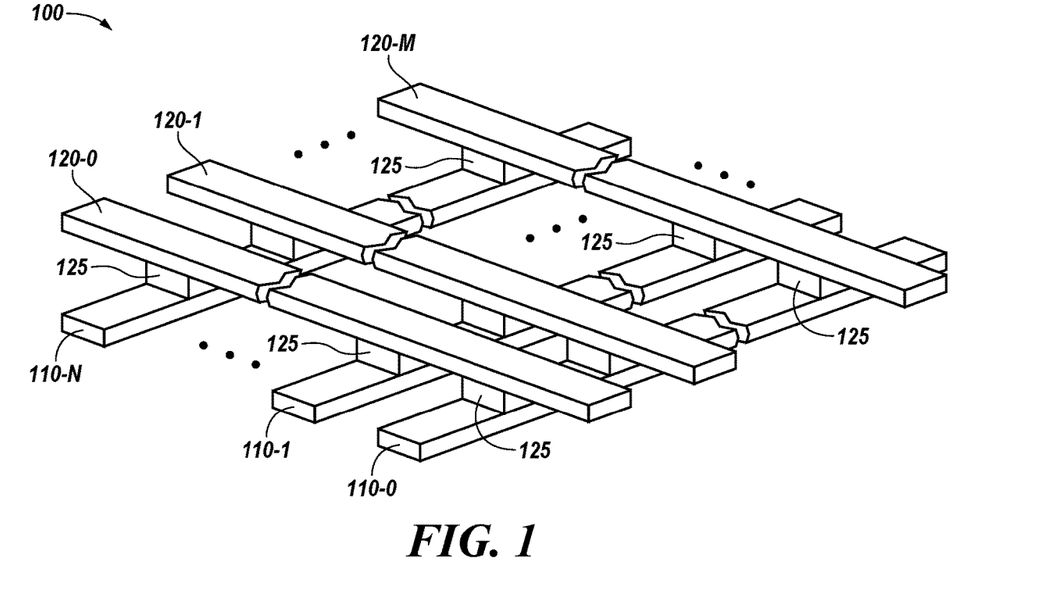
FIG. 1 is a three-dimensional view of an example of a memory array, in accordance with an embodiment of the present disclosure.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality of second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states. In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a cross-point architecture in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures.

Embodiments of the present disclosure, however, are not limited to the example memory array architecture illustrated in FIG. 1. For example, embodiments of the present disclosure can include a three-dimensional memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
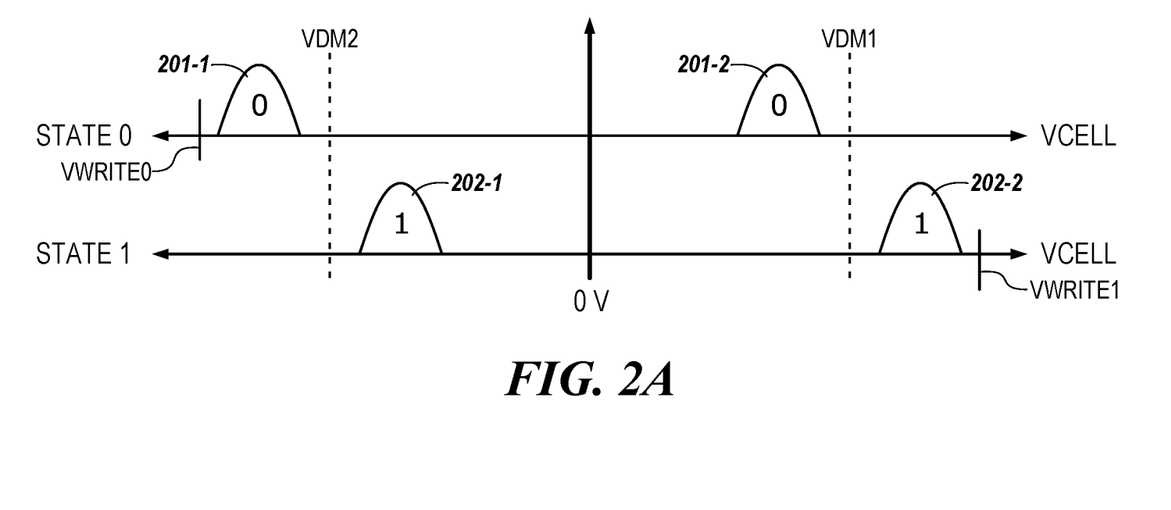
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., state 0 or state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL=VWL). The threshold voltage distributions (e.g., ranges) 201-1, 201-2, 202-1, and 202-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
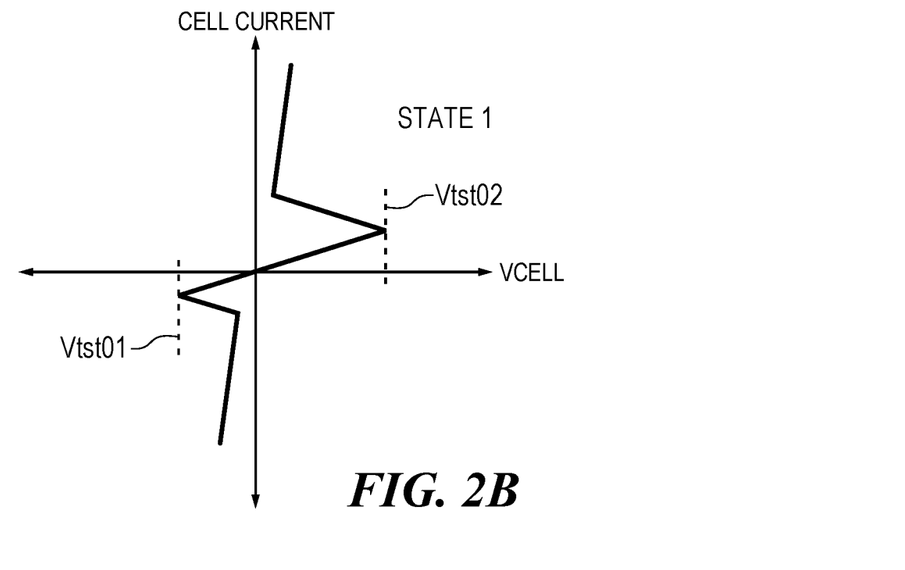
FIG. 2B is an example of a current-versus-voltage curve corresponding to a memory state of FIG. 2A, in accordance with an embodiment of the present disclosure.
Figure 2C:
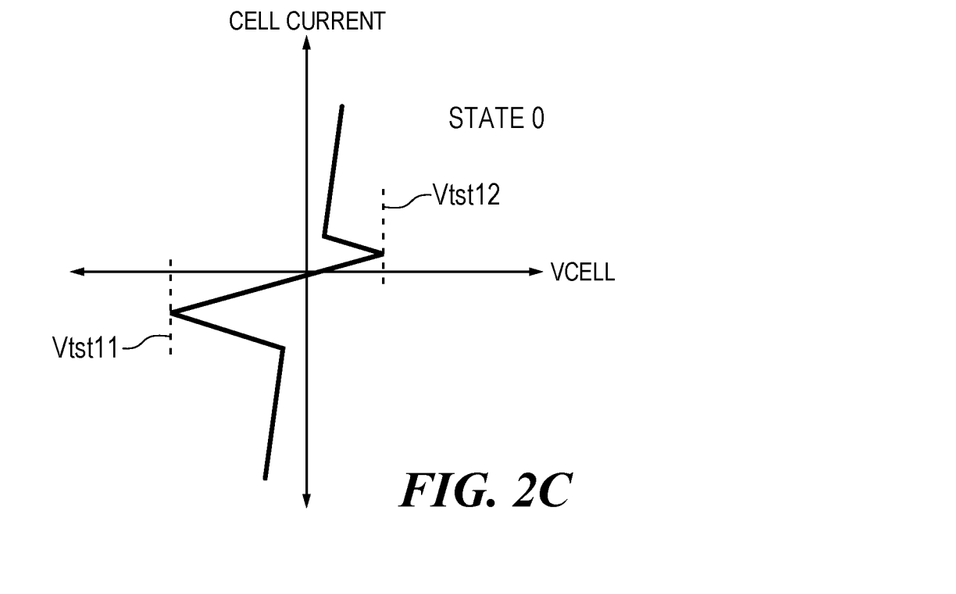
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to a reset state (e.g., state 0) or a set state (e.g., state 1) may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 202-1 and 202-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 202-2). Similarly, VDM2 is a negative voltage used to distinguish cells in state 1 (e.g., threshold voltage distribution 202-1) from cells in state 0 (e.g., threshold voltage distribution 201-1). In the examples of FIGS. 2A-2C, a memory cell 125 in a positive state 1 does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 does not snap back in response to applying VDM2.

Embodiments are not limited to the example shown in FIG. 2A. For example, the designations of state 0 and state 1 can be interchanged (e.g., distributions 201-1 and 201-2 can be designated as state 1 and distributions 202-1 and 202-2 can be designated as state 0). Further, in some examples, the magnitude of VDM1 can be adjusted (e.g., increased) to cancel threshold voltage drift that may occur in the memory cells, as will be further described herein.

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 200-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 202-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event can be used to write a cell to the opposite state (e.g., from state 1 to state 0 and vice versa).

As memory cells 125 are repeatedly sensed (e.g., read), the magnitudes of their snapback voltages (e.g., Vtst 01, Vtst 02, Vtst11, and Vtst12) may drift (e.g., change) due to the stress caused by continuously applying the demarcation voltages (e.g., VDM1 and VDM2) to the cells, which in turn may make it easier or more difficult for the cells to snap back. If this degradation of the memory cell (e.g., read disturb) is not compensated for in a manner as will be further described herein, the cell may be sensed to be in a different data state than the state to which the cell was actually programmed. For instance, if this degradation is not compensated for in a manner as will be further described herein, a memory cell that is programmed to the reset state (e.g., state 0) may erroneously be sensed to be in the set state (e.g., state 1).

Figure 3:
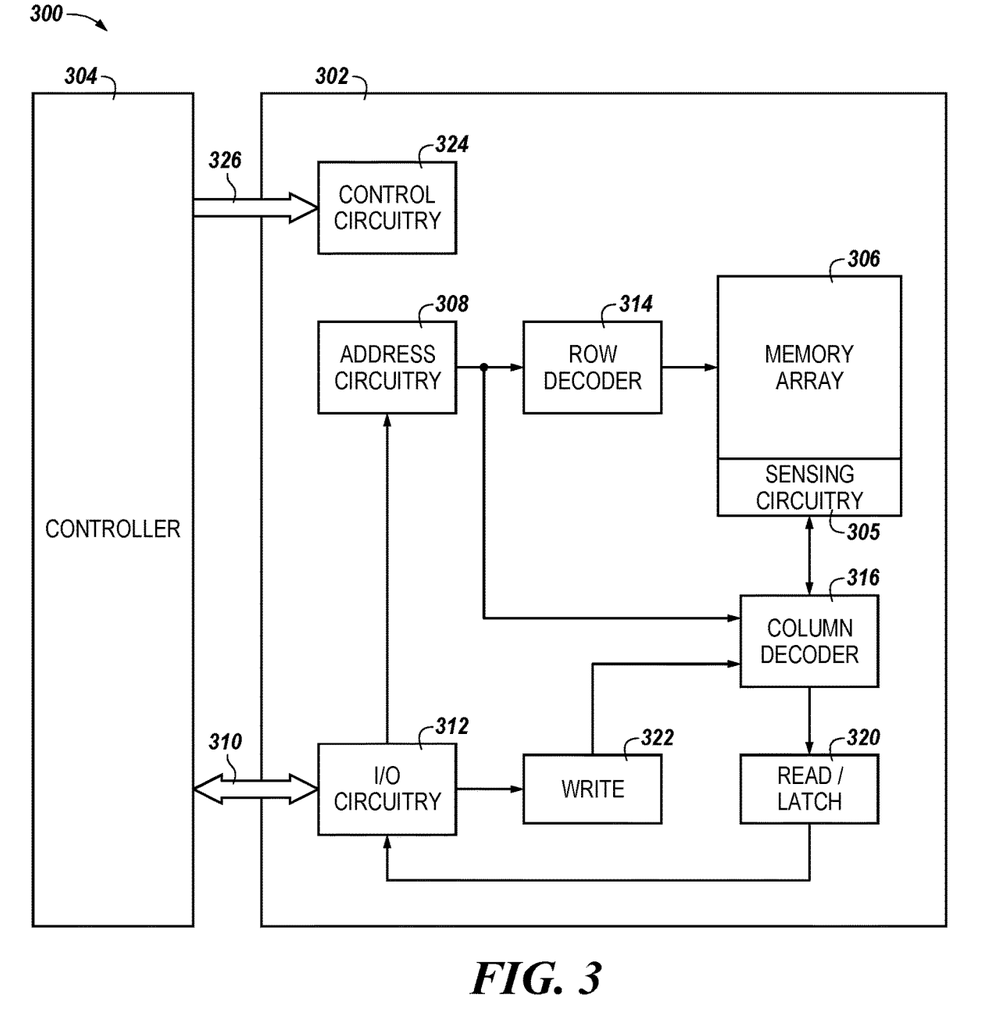
FIG. 3 is a block diagram illustration of an example apparatus, in accordance with an embodiment of the present disclosure.

FIG. 3 is a block diagram illustration of an example apparatus, such as an electronic memory system 300, in accordance with an embodiment of the present disclosure. Memory system 300 may include an apparatus, such as a memory device 302 and a controller 304, such as a memory controller (e.g., a host controller). Controller 304 might include a processor, for example. Controller 304 might be coupled to a host, for example, and may receive command signals (or commands), address signals (or addresses), and data signals (or data) from the host and may output data to the host.

Memory device 302 includes a memory array 306 of memory cells. For example, memory array 306 may include one or more of the memory arrays, such as a cross-point array, of memory cells disclosed herein. Memory device 302 may include address circuitry 308 to latch address signals provided over I/O connections 310 through I/O circuitry 312. Address signals may be received and decoded by a row decoder 314 and a column decoder 316 to access the memory array 306. For example, row decoder 314 and/or column decoder 316 may include drivers.

Memory device 302 may sense (e.g., read) data in memory array 306 by sensing voltage and/or current changes in the memory array columns using sense/buffer circuitry that in some examples may include read/latch circuitry 320 and/or sensing circuitry 305. Read/latch circuitry 320 may read and latch data from the memory array 306. Sensing circuitry 305 may include a number of sense amplifiers coupled to memory cells of memory array 306, which may operate in combination with the read/latch circuitry 320 to sense (e.g., read) memory states from targeted memory cells. I/O circuitry 312 may be included for bi-directional data communication over the I/O connections 310 with controller 304. Write circuitry 322 may be included to write data to memory array 306.

Control circuitry 324 may decode signals provided by control connections 326 from controller 304. These signals may include chip signals, write enable signals, and address latch signals that are used to control the operations on memory array 306, including data read and data write operations.

Control circuitry 324 may be included in controller 304, for example. Controller 304 may include other circuitry, firmware, software, or the like, whether alone or in combination. Controller 304 may be an external controller (e.g., in a separate die from the memory array 306, whether wholly or in part) or an internal controller (e.g., included in a same die as the memory array 306). For example, an internal controller might be a state machine or a memory sequencer.

In some examples, controller 304 can be configured to predict and compensate for degradation of (e.g., read disturb in) the memory cells of memory array 306. For example, controller 304 can reliably (e.g., accurately) predict when read disturb in memory cells that were programmed to a reset data state (e.g., state 0) has occurred and/or will occur, and accordingly can provide a reliable indicator of when to perform a refresh operation on the memory cells to compensate for the read disturb. For example, controller 304 can use the quantity of sense operations being performed on the memory cells (e.g., the read workload of the cells) to determine when to trigger an evaluation of whether a refresh operation on the memory cells is needed to compensate for read disturb. The evaluation can include performing two sense operations (e.g., a double read operation) on the memory cells using sensing voltages of opposite polarities, and the result of the two sense operations can be used by controller 304 to determine whether to perform a refresh operation on the memory cells.

For example, controller 304 can determine when the quantity of sense (e.g., read) operations performed on a group of memory cells of memory array 306 has met or exceeded a threshold quantity. In some examples, controller 304 can determine when the quantity of sense operations has met or exceeded the threshold quantity within a particular (e.g., short) amount of time. The threshold quantity can be, for example, every 10,000 sense operations (e.g., 10,000 sense operations within 1 second). Controller 304 can determine when the quantity of sense operations has met or exceeded the threshold quantity using a counter (e.g., a counter that counts the sense operations being performed on the group of memory cells), for instance.

The group of memory cells can be, for example, a page of memory cells of memory array 306 that stores a codeword data pattern. For example, memory array 306 can be divided into addressable groups of memory cells that can be programmed in response to program (e.g., write) commands that address the groups and that can be sensed in response to sense (e.g., read) commands that address the groups. In some examples, the groups of memory cells can have a physical address that corresponds to a logical address received from a host. Controller 304 can include a logical-to-physical (L2P) mapping component that can map the logical addresses from the host to the physical addresses of the groups of memory cells. The groups of memory cells can be pages corresponding to the logical addresses. For example, each group can store a data pattern (e.g., a data structure) that can be referred to as a managed unit, such as a codeword.

Upon determining the quantity of sense operations performed on the group of memory cells has met or exceeded the threshold quantity, controller 304 can perform two sense operations (e.g., a double read operation) on the memory cells using sensing voltages of opposite polarities. For example, controller 304 can perform a sense operation on the group of memory cells using a positive sensing voltage to determine the data state (e.g., set or reset) of each of the cells, and a sense operation on the group of memory cells using a negative sensing voltage to determine the data state of each of the cells. However, these two sense operations (e.g., the double read operation) may only be performed by controller 304 upon determining the quantity of sense operations has met or exceeded the threshold quantity (e.g., the double read operation is not performed if the threshold quantity is not met or exceeded).

The magnitude of the negative sensing voltage of the double read operation can be equal to the magnitude of a negative sensing voltage used to determine the data state of the memory cells (e.g., to distinguish the cells of the group in the set data state from the cells of the group in the reset data state) during the quantity of sense operations performed on the group. For example, the magnitude of the negative sensing voltage of the double read operation can be equal to VDM2 illustrated in FIG. 2A (e.g., the negative sensing voltage can be VDM2).

The magnitude of the positive sensing voltage of the double read operation can be a magnitude that has been adjusted (e.g., by controller 304) from (e.g., offset relative to) the magnitude of a positive sensing voltage used to determine the data state of the memory cells during the quantity of sense operations performed on the group. For example, the magnitude of the positive sensing voltage of the double read operation can be greater than VDM1 illustrated in FIG. 2A. Adjusting the magnitude of the positive sensing voltage of the double read operation in such a manner can account for any threshold voltage drift that may have occurred in the memory cells of the group (e.g., in the cells that were programmed to the reset data state).

For instance, in some examples, controller 304 can increase the magnitude of the positive sensing voltage used to determine the data state of the memory cells during the quantity of sense operations performed on the group from VDM1 to cancel any threshold voltage drift that may have occurred in the memory cells that were programmed to the reset data state. That is, the increased magnitude can be used to cancel the threshold voltage drift, and a sensing voltage having such an increased magnitude can be referred to herein as a drift cancellation sensing voltage. In such examples, the magnitude of the positive sensing voltage of the double read operation can be less than (e.g., decreased by controller 304 from) the increased magnitude of the positive drift cancellation sensing voltage, but still greater than VDM1. Decreasing the magnitude of the positive sensing voltage of the double read operation from the increased magnitude of the positive drift cancellation sensing voltage in such a manner can allow controller 304 to predict the memory cells of the group in which read disturb has already occurred, and also predict which memory cells of the group may be susceptible to read disturb (e.g., in which memory cells of the group read disturb may soon occur) even if read disturb has not yet occurred in those cells.

For example, the amount by which the magnitude of the positive sensing voltage of the double read operation is less than (e.g., decreased from) the increased magnitude of the positive drift cancellation sensing voltage can be based on a projected threshold voltage drift (e.g., an estimated speed of the threshold voltage drift) of the memory cells of the group. For instance, this amount can be pre-determined (e.g., during manufacture of memory device 302) and coded into the firmware of controller 304. As an example, this amount can be 280 millivolts (mV). However, embodiments of the present disclosure are not limited to this example.

As an additional example, the amount by which the magnitude of the positive sensing voltage of the double read operation is decreased from the increased magnitude of the positive drift cancellation sensing voltage can be based on the quantity of sense operations performed on (e.g., the read workload of) the group of memory cells. For instance, controller 304 can determine, and tune the previously coded adjustment by, this amount during operation of memory device 302.

As an additional example, the amount by which the magnitude of the positive sensing voltage of the double read operation is decreased from the increased magnitude of the positive drift cancellation sensing voltage can be based on an error rate (e.g., a bit error rate) associated with an error correction operation performed on the data sensed during the quantity of sense operations performed on the group of memory cells. For example, controller 304 can determine, and tune the previously coded adjustment by, this amount during operation of memory device 302. For instance, controller can tune the previously coded adjustment by this amount upon the error rate meeting or exceeding a particular threshold. As an example, this amount can be 200 mV. However, embodiments of the present disclosure are not limited to this example.

The error rate (e.g., bit error rate) can refer to the quantity of erroneous bits corresponding to an amount of erroneous data from the data sensed during the quantity of sense operations divided by the total amount of data sensed during the quantity of sense operations (e.g., the sample size). As such, the error rate associated with the error correction operation can be determined by dividing the quantity of erroneous bits to be corrected during the error correction operation by the total quantity of data sensed during the sense operations.

Upon any memory cells of the group being determined (e.g., sensed) to be in the reset data state (e.g., state 0) by both of the sense operations of the double read operation, controller 304 can perform an operation to program the cells of the group determined to be in the reset data state by both of the sense operations of the double read operation to the reset data state. For instance, the operation can be a refresh operation (e.g., a write refresh operation) to refresh the memory cells of the group that were programmed to the reset data state to their original reset data state in order to compensate for the read disturb in the cells. However, the refresh operation may only be performed by controller 304 upon any of the memory cells of the group being determined to be in the reset data state by both of the sense operations of the double read operation (e.g., the refresh operation is not performed if none of the memory cells of the group are determined to be in the reset data state by both of the sense operations of the double read operation). Further, the refresh operation may be performed only on those cells of the group determined to be in the reset data state by both of the sense operations of the double read operation (e.g., the refresh operation is not performed on the cells of the group that are not determined to be in the reset data state by both of the sense operations).

In some examples, the refresh operation can include applying a set voltage pulse to the memory cells of the group determined to be in the reset data state by both sense operations of the double read operation, and then applying a reset voltage pulse to those memory cells after (e.g., immediately after) applying the set voltage pulse (e.g., the set pulse is applied before the reset pulse). The set and reset voltage pulses can have opposite polarities. For instance, the set voltage pulse can have a negative polarity, and the reset voltage pulse can have a positive polarity. Further, the set and reset voltage pulses can have the same magnitude and the same duration.

In some examples, the refresh operation can include applying only a reset voltage pulse to the memory cells of the group determined to be in the reset data state by both sense operations of the double read operation (e.g., in some examples, a set pulse may not be applied to those cells before the reset pulse). The reset voltage pulse can have a positive polarity, and can have the same magnitude and duration as the reset voltage pulse of the previous example.

Figure 4:
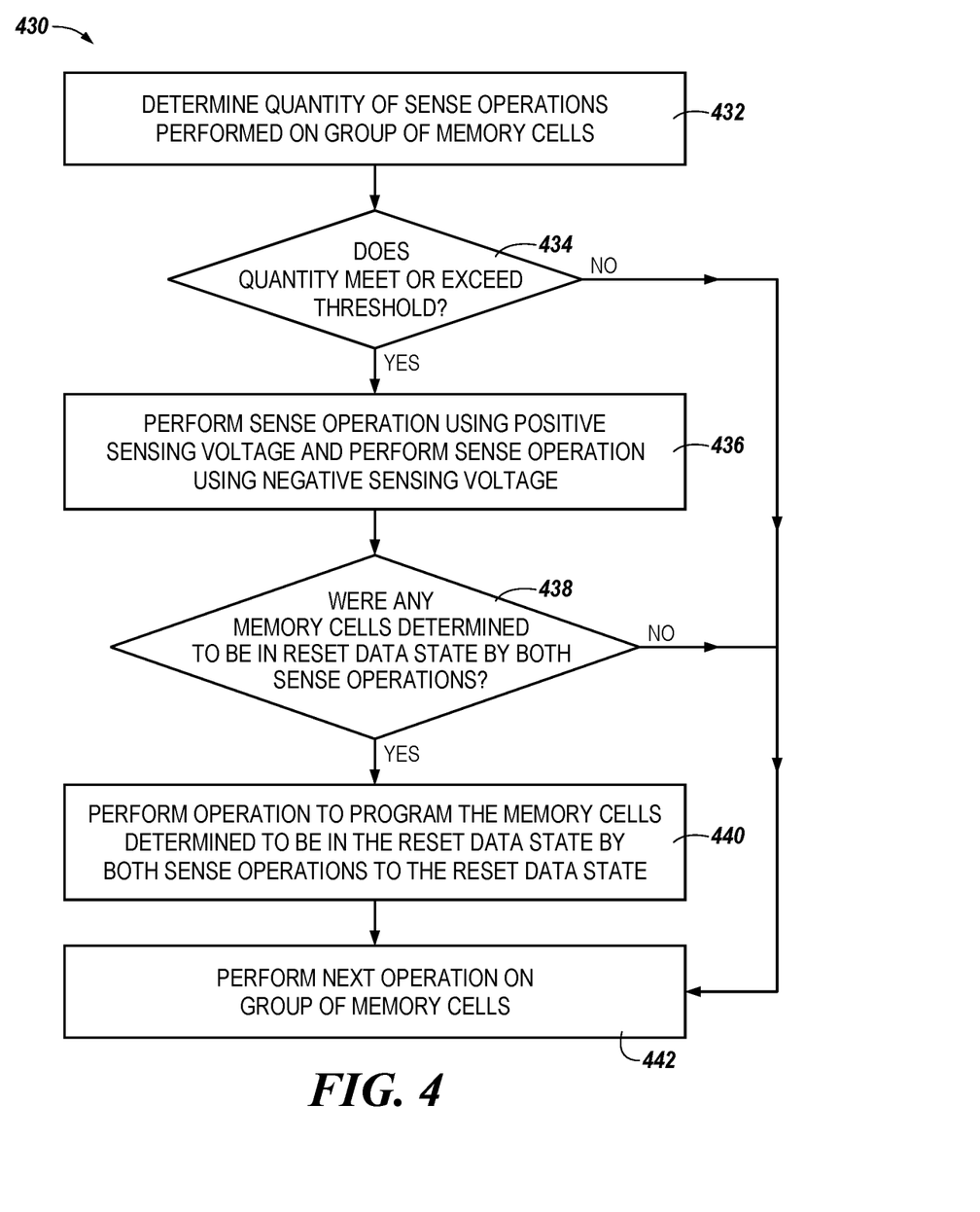
FIG. 4 illustrates an example method for predicting and compensating for degradation of memory cells, in accordance with an embodiment of the present disclosure.

FIG. 4 illustrates an example method 430 for predicting and compensating for degradation of memory cells, in accordance with an embodiment of the present disclosure. Method 430 can be performed, for example, by controller 304 previously described in connection with FIG. 3.

At block 432, a quantity of sense operations performed on a group of memory cells is determined. The group of memory cells can be, for example, a group (e.g., page) of memory cells of memory array 306 previously described in connection with FIG. 3. The quantity of sense operations performed on the group of memory cells can be determined, for example, using a counter, as previously described herein (e.g., in connection with FIG. 3).

At block 434, it is determined whether the quantity of sense operations performed on the group of memory cells meets or exceeds a threshold quantity of sense operations. For instance, it can be determined whether the quantity of sense operations meets or exceeds the threshold quantity within a particular amount of time, as previously described herein (e.g., in connection with FIG. 3). If it is determined the quantity of sense operations does not meet or exceed the threshold quantity, method 430 proceeds to block 442. If it is determined the quantity of sense operation meets or exceeds the threshold quantity, method 430 proceeds to block 436.

At block 436, a sense operation is performed on the group of memory cells using a positive sensing voltage to determine the data state of each cell of the group, and a sense operation is performed on the group of memory cells using a negative sensing voltage to determine the data state of each cell of the group. These two sense operations can be performed as part of a double read operation to evaluate whether a refresh operation on the memory cells is needed to compensate for read disturb in the cells, as previously described herein (e.g., in connection with FIG. 3).

At block 438, it is determined whether any memory cells of the group were determined (e.g., sensed) to be in the reset data state (e.g., state 0) by both of the sense operations performed at block 436. If it is determined that none of the memory cells of the group were determined to be in the reset data state by both sense operations, method 430 proceeds to block 442. If it is determined that any (e.g., one or more) of the memory cells of the group were determined to be in the reset data state by both sense operations, method 430 proceeds to block 440.

At block 440, an operation is performed to program the memory cells of the group determined to be in the reset data state by both of the sense operations to the reset data state. This operation can be a refresh operation to refresh the memory cells of the group that were programmed to the reset data state to their original reset data state in order to compensate for read disturb in the cells, as previously described herein (e.g., in connection with FIG. 3). Method 430 then proceeds to block 442.

At block 442, the next operation to be performed on the group of memory cells is performed. This operation can be, for instance, a program (e.g., write), sense (e.g., read), or erase operation. For instance, this operation can be the next read, write, or erase operation in a sequence of operations being performed on the group of memory cells.

Figure 5A:
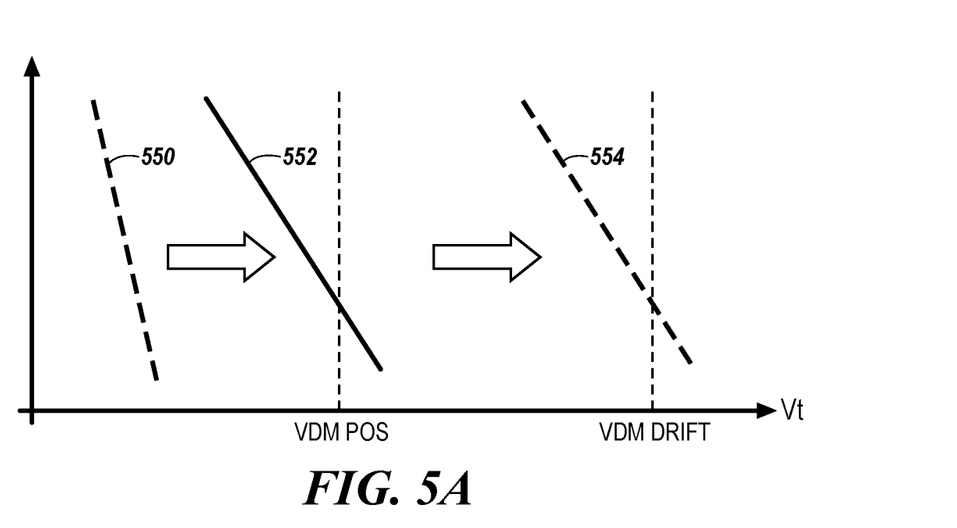
FIGS. 5A-5B illustrate a conceptual example of predicting and compensating for degradation of memory cells, in accordance with an embodiment of the present disclosure.
Figure 5B:
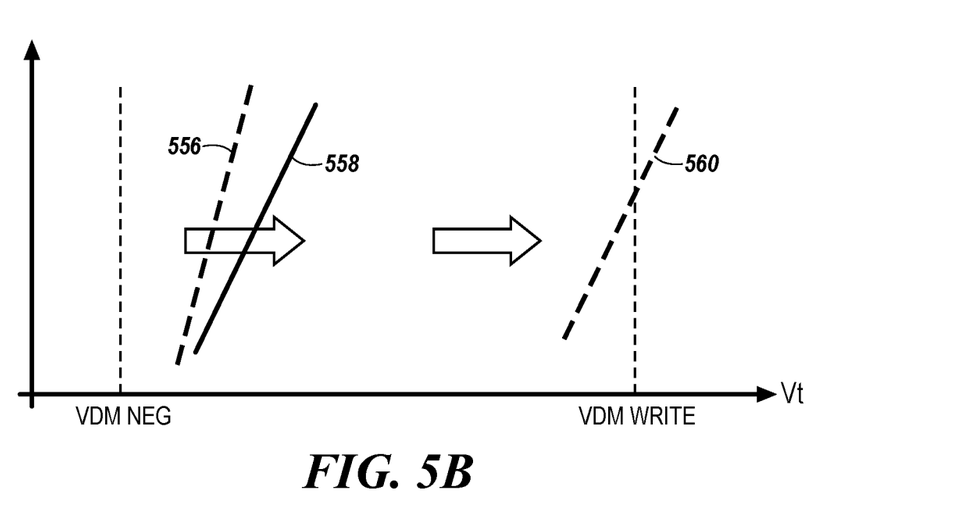

FIGS. 5A-5B illustrate a conceptual example of predicting and compensating for degradation of memory cells, in accordance with an embodiment of the present disclosure. For instance, FIG. 5A illustrates a conceptual example of threshold voltage distributions associated with a reset data state of memory cells, such as memory cells 125 illustrated in FIG. 1, for a positive polarity, and FIG. 5B illustrates a conceptual example of threshold voltage distributions associated with the reset data state of the memory cells for a negative polarity.

For example, in FIG. 5A, threshold voltage distribution 550 represents the magnitudes of the threshold voltages to which the memory cells were previously programmed for the positive polarity, which can correspond to threshold voltage distribution 201-2 illustrated in FIG. 2A. In FIG. 5B, threshold voltage distribution 556 represents the magnitudes of the threshold voltages to which the memory cells were previously programmed for the negative polarity, which can correspond to threshold voltage distribution 201-1 illustrated in FIG. 2A. Further, threshold voltage distributions 552 and 558 shown in FIGS. 5A and 5B, respectively, represent the present, actual threshold voltages of the memory cells to which the cells have drifted over time (e.g., due to read disturb occurring in the cells). Further, threshold voltage distributions 554 and 560 shown in FIGS. 5A and 5B, respectively, represent threshold voltages of the memory cells to which the cells could possibly (e.g., potentially) drift in the future (e.g., due to additional read disturb occurring in the cells) if an operation to refresh the memory cells to compensate for the read disturb in accordance with the present disclosure is not performed. Further, VDM DRIFT shown in FIG. 5A can correspond to the positive drift cancellation sensing voltage previously described in connection with FIG. 3, VDM POS shown in FIG. 5A can correspond to the positive sensing voltage used during the double read operation previously described in connection with FIG. 3, VDM NEG shown in FIG. 5B can correspond to the negative sensing voltage used during the double read operation previously described in connection with FIG. 3, and VDM WRITE shown in FIG. 5B can correspond to VWRITE0 illustrated in FIG. 2A.

As illustrated in FIGS. 5A and 5B, if an operation to refresh the memory cells to compensate for the read disturb in accordance with the present disclosure is not performed, the threshold voltages of some of the memory cells would in the future be sensed to be greater than VDM DRIFT and VDM WRITE, respectively (e.g., a portion of distribution 554 is greater than VDM DRIFT, and a portion of distribution 560 is greater than VDM WRITE). Accordingly, some of the memory cells (e.g., the cells whose threshold voltages are sensed to be greater than VDM DRIFT or VDM WRITE) would in the future erroneously be determined to be in a different data state (e.g., the set data state) than the state to which they were programmed (e.g., reset data state) if an operation to refresh the memory cells to compensate for the read disturb in accordance with the present disclosure is not performed.

As illustrated in FIGS. 5A and 5B, if the double read operation previously described in connection with FIG. 3 is performed (e.g., triggered) at the present, the threshold voltages of some of the memory cells would be sensed by the double read operation to be greater than both VDM POS and VDM NEG (e.g., a portion of distribution 552 is greater than VDM POS, and all of distribution 558 is greater than VDM NEG). These memory cells (e.g., the cells whose threshold voltages are sensed to be greater than both VDM POS and VDM NEG) would be sensed to be in the reset data state by both of the sense operations of the double read operation, and accordingly would be the memory cells on which the operation to refresh the memory cells to compensate for the read disturb would be performed (e.g., so that the cells can be refreshed before the read disturb would cause the threshold voltage distributions to drift to distributions 554 and 560).

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory having a group of memory cells; and
   circuitry configured to:
   perform a sense operation on the group of memory cells using a positive sensing voltage and perform a sense operation on the group of memory cells using a negative sensing voltage; and
   perform an operation to program the memory cells of the group determined to be in a particular data state by both of the sense operations to the particular data state.

2. The apparatus of claim 1, wherein the particular data state is a reset data state.

3. The apparatus of claim 1, wherein the circuitry is configured to perform both of the sense operations on the group of memory cells upon a quantity of sense operations performed on the group of memory cells meeting or exceeding a threshold quantity.

4. The apparatus of claim 3, wherein a magnitude of the positive sensing voltage is less than a magnitude of a sensing voltage used to determine a data state of the memory cells of the group during the quantity of sense operations performed on the group.

5. The apparatus of claim 3, wherein a magnitude of the negative sensing voltage is equal to a magnitude of a sensing voltage used to determine a data state of the memory cells of the group during the quantity of sense operations performed on the group.

6. The apparatus of claim 1, wherein the group of memory cells comprises self-selecting memory cells.

7. A method of operating memory, comprising:
   performing a first sense operation on a group of memory cells using a first sensing voltage to determine a data state of each of the memory cells;
   performing a second sense operation on the group of memory cells using a second sensing voltage to determine a data state of each of the memory cells; and
   performing an operation to program the memory cells of the group determined to be in a reset data state by both the first sense operation and the second sense operation to the reset data state.

8. The method of claim 7, wherein the method includes:
   determining a quantity of sense operations performed on the group of memory cells has met or exceeded a threshold quantity; and
   performing the first sense operation, the second sense operation, and the operation upon determining the quantity of sense operations has met or exceeded the threshold quantity.

9. The method of claim 8, wherein a magnitude of the first sensing voltage has been adjusted from a magnitude of a sensing voltage used to determine a data state of the memory cells of the group during the quantity of sense operations performed on the group.

10. The method of claim 9, wherein the adjustment of the magnitude of the first sensing voltage from the magnitude of the sensing voltage used to determine the data state of the memory cells of the group during the quantity of sense operations performed on the group is based on a projected drift of a threshold voltage of the memory cells of the group.

11. The method of claim 9, wherein the adjustment of the magnitude of the first sensing voltage from the magnitude of the sensing voltage used to determine the data state of the memory cells of the group during the quantity of sense operations performed on the group is based on the quantity of sense operations performed on the group of memory cells.

12. The method of claim 9, wherein the adjustment of the magnitude of the first sensing voltage from the magnitude of the sensing voltage used to determine the data state of the memory cells of the group during the quantity of sense operations performed on the group is based on an error rate associated with an error correction operation performed on data sensed during the quantity of sense operations performed on the group of memory cells.

13. The method of claim 8, wherein the method includes determining the quantity of sense operations performed on the group of memory cells has met or exceeded a threshold quantity within a particular amount of time.

14. The method of claim 7, wherein the first sensing voltage is a positive sensing voltage.

15. The method of claim 7, wherein the first sensing voltage is a negative sensing voltage.

16. An apparatus, comprising:
a memory having a group of memory cells; and
circuitry configured to:
   perform a first sense operation on the group of memory cells using a positive sensing voltage;
   perform a second sense operation on the group of memory cells using a negative sensing voltage; and
   perform an operation to program the memory cells of the group determined to be in a reset data state by both the first sense operation and the second sense operation to the reset data state.

17. The apparatus of claim 16, wherein the operation includes applying a reset voltage pulse to the memory cells of the group determined to be in the reset data state by both the first sense operation and the second sense operation.

18. The apparatus of claim 17, wherein the operation includes applying a set voltage pulse to the memory cells of the group determined to be in the reset data state by both the first sense operation and the second sense operation before applying the reset voltage pulse.

19. The apparatus of claim 17, wherein the reset voltage pulse has a positive polarity.

20. The apparatus of claim 16, wherein the reset data state is associated with an asymmetric threshold voltage distribution.

* * * * *